United States Patent
Koehler

(10) Patent No.: US 8,580,600 B2
(45) Date of Patent: Nov. 12, 2013

(54) CAMERA AND PRODUCTION METHOD FOR A CAMERA

(75) Inventor: Thorsten Koehler, Deuerling (DE)

(73) Assignee: Continental Automotive GmbH, Hannover (DE)

( * ) Notice: Subject to any disclaimer, the term of this patent is extended or adjusted under 35 U.S.C. 154(b) by 584 days.

(21) Appl. No.: 12/743,872

(22) PCT Filed: Nov. 12, 2008

(86) PCT No.: PCT/EP2008/065400
§ 371 (c)(1),
(2), (4) Date: May 20, 2010

(87) PCT Pub. No.: WO2009/065759
PCT Pub. Date: May 28, 2009

(65) Prior Publication Data
US 2010/0259672 A1 Oct. 14, 2010

(30) Foreign Application Priority Data
Nov. 20, 2007 (DE) .......... 10 2007 055 322

(51) Int. Cl.
*H01L 31/18* (2006.01)
(52) U.S. Cl.
USPC .......... 438/68; 348/374; 257/E31.11
(58) Field of Classification Search
USPC .......... 438/68; 348/374
See application file for complete search history.

(56) References Cited

U.S. PATENT DOCUMENTS

| | | | |
|---|---|---|---|
| 6,635,941 B2 | 10/2003 | Suda | |
| 7,405,764 B2 | 7/2008 | Gustavsson et al. | |
| 7,688,309 B2* | 3/2010 | Theytaz et al. | 345/166 |
| 2003/0234886 A1 | 12/2003 | Cho et al. | |
| 2004/0169763 A1 | 9/2004 | Ikeda | |
| 2004/0223072 A1 | 11/2004 | Maeda et al. | |
| 2005/0059188 A1 | 3/2005 | Bolken et al. | |
| 2006/0151847 A1 | 7/2006 | Kwon et al. | |
| 2007/0018088 A1 | 1/2007 | Huang et al. | |
| 2008/0087974 A1* | 4/2008 | Kwon et al. | 257/432 |

FOREIGN PATENT DOCUMENTS

| | | |
|---|---|---|
| EP | 1244151 A2 | 9/2002 |
| EP | 1434426 A2 | 6/2004 |
| EP | 1471730 A1 | 10/2004 |
| JP | 2003332549 A | 11/2003 |

* cited by examiner

*Primary Examiner* — Alexander Ghyka
(74) *Attorney, Agent, or Firm* — Laurence A. Greenberg; Werner H. Stemer; Ralph E. Locher

(57) ABSTRACT

An image capturing system includes an optical component, a sensor below and connected to the optical component for capturing radiation, and a chip below the sensor for processing and/or storing and/or transmitting information captured by the sensor. The sensor and the Chip are directly connected to each other. The disclosure further relates to a production method for an image capturing system.

6 Claims, 2 Drawing Sheets

CAMERA AND PRODUCTION METHOD FOR A CAMERA

BACKGROUND OF THE INVENTION

Field of the Invention:

The invention relates to an image acquisition system comprising an optical component, a sensor for detecting radiation, and a chip for processing and/or storing and/or forwarding information captured by the sensor.

A digital camera records images using image sensors. In addition the camera typically processes, stores and possibly also forwards the information captured by the image sensor. A multiplicity of applications exist for cameras of this type. Automotive engineering is one example thereof. Thus, for instance, there exist a multiplicity of driver assistance systems in which the vehicle environment and/or the vehicle interior are recorded and analyzed.

The term "Advanced Driver Assistance Systems" (ADAS) encompasses functions which serve to assist the driver of a motor vehicle. Frequently the aim of driver assistance systems is to increase safety by avoiding hazardous situations before they arise and by assisting the driver in avoiding accidents in critical situations. Further objectives are to improve comfort by reducing stress and to lighten the driver's workload in standard situations, to make it easier for the driver to find his/her bearings by providing environmental information that is processed according to the situation and conveyed in a driver-friendly manner, and also to increase driving enjoyment.

Examples of driver assistance functions are acceleration slip regulation/traction control systems such as ABS (anti-lock braking system), ASR (acceleration slip regulation), ESP (electronic stability program), EDS (electronic differential lock), as well as adaptive forward lighting, high- and dipped-beam headlight assistant, night vision systems, cruise control, parking aid, braking assistant, ACC (adaptive cruise control), distance alert, turn assistant, traffic jam assistant, lane detection system, lane-keeping assistant, lane-holding support, lane-change assistant, ISA (intelligent speed adaption), ANB (automatic emergency braking), curve assistant, tire pressure monitoring system, driver state detection, traffic sign detection, platooning.

Cameras employed in driver assistance systems should satisfy the following requirements: they should be small, since there is generally little space available in the vehicle interior. They should also be cheap and easy to produce. Finally they should be properly adjusted already, since a readjustment is usually not possible after the camera has been installed.

EP 1471730 A1 discloses a miniature camera module, in particular for use in mobile telephones and PDAs, having a lens which is focused and glued in place above the image sensor at the end of the manufacturing process.

EP 1434426 A2 discloses a camera module and a manufacturing method, wherein a lens is bonded to the surface of an image sensor chip. The image sensor chip can then be electrically contacted on a printed circuit board. The camera module is suitable in particular for portable devices such as mobile telephones.

BRIEF SUMMARY OF THE INVENTION

The object underlying the invention is to disclose an image acquisition system which is suitable in particular for use as part of a driver assistance system. A suitable production method for this is also to be disclosed.

This object is achieved by means of an image acquisition system having the features of claim 1, as well as by means of a method having the features of a coordinated claim. Advantageous embodiments and developments are the subject matter of dependent claims.

The image acquisition system according to the invention comprises an optical component, a sensor for detecting radiation, said sensor being located underneath the optical component and joined to the optical component, and a chip for processing and/or storing and/or forwarding information captured by the sensor, said chip being located underneath the sensor and joined to the sensor.

The optical component serves to direct radiation onto the sensor. The sensor detects the radiation passing the optical component and impinging on it or detects at least a part of said radiation. For example, the sensor can be embodied for detecting radiation in a specific wavelength range.

A connection exists between the sensor and the chip to enable the data captured by the sensor to reach the chip so that the latter can process and/or store and/or forward said data. The chip can be e.g. a digital signal processor, a microcontroller, a memory or an LVDS data transmission circuit.

Looking perpendicularly onto the optical component, i.e. along its optical axis, referred to in the following as the vertical direction, the sensor is located below the optical component, and the chip is located below the sensor. This corresponds to a stack-like arrangement of optical component, sensor and chip. Said three components preferably extend to roughly the same degree in the plane normal to the vertical direction. In this case no one of the three components projects substantially beyond the others in said plane.

The optical component and the sensor are joined directly to each other, e.g. by gluing. The sensor and the chip are also joined directly to each other, e.g. by soldering or gluing.

As well as optical component, sensor and chip, the image acquisition system can include further components, e.g. one or more further chips. Said further chip or chips can be arranged either below the already mentioned chip or next to the stack arrangement of optical component, sensor and chip.

In a development of the invention at least one further chip is present for processing and/or storing and/or forwarding information captured by the sensor, which is located beneath the chip and joined to the latter. The further chip or one or more of the further chips can be a chip of similar type compared to the first-mentioned chip; preferably said chips are of a different type, i.e. chips which perform different functions in relation to the information captured by the sensor.

According to a development of the invention the further chip is part of a wafer containing a plurality of similar further chips. In respect of the latter and also the embodiments cited hereinbelow, a wafer or slice is a body of substantially two-dimensional extension. The chips—or the other components cited in the following—are in this case located on or in the wafer. As a result a plurality of chips are present in the plane of the wafer or parallel to said plane. The arrangement of the chips can be symmetrical, e.g. in the form of a grid or a matrix.

In addition or alternatively to the presence of a wafer containing further chips, other wafers can be used which are described in the following. Various combinations are possible in this case; i.e. all, some, only one or even none of the components can be present in the form of wafers. Thus, the optical component can be part of a wafer containing a plurality of similar optical components. The sensor too can be part of a wafer containing a plurality of similar sensors. The chip can likewise be part of a wafer containing a plurality of similar chips.

In an embodiment of the invention a plated-through hole exists for establishing an electrical connection between the sensor and the chip. This corresponds to a connection in the vertical direction.

It is furthermore possible that a printed circuit board is located beneath the chip and joined to it, wires being present for electrically connecting the printed circuit board to the chip and the sensor.

In the inventive method for producing an image acquisition system, an optical component, a sensor for detecting radiation, and a chip for processing and/or storing and/or forwarding information captured by the sensor are joined to one another in such a way that the sensor is located beneath the optical component and the chip is located beneath the sensor. In this arrangement the optical component is part of a wafer containing a plurality of similar optical components and the sensor is part of a wafer containing a plurality of similar sensors and the chip is part of a wafer containing a plurality of similar chips. Once optical component, sensor and chip have been joined, the wafers are sawn.

When the different components are joined, the entire wafers are preferably joined to one another.

Following the joining of the three wafers, a plurality of image acquisition systems are present which are separated from one another by the sawing operation.

The optical component and the sensor can be joined to each other e.g. by gluing. The sensor and the chip can be joined to each other e.g. by gluing or soldering.

It is possible, following the sawing process, to establish an electrical connection between the sensor and the chip at at least one sawing edge.

The method according to the invention is suitable in particular for producing an inventive image acquisition system, this also being applicable to the embodiments and developments. For that purpose it can comprise further suitable steps.

The invention is explained in more detail below with reference to an exemplary embodiment and the attached drawings, in which:

DESCRIPTION OF THE INVENTION

Figure 1:
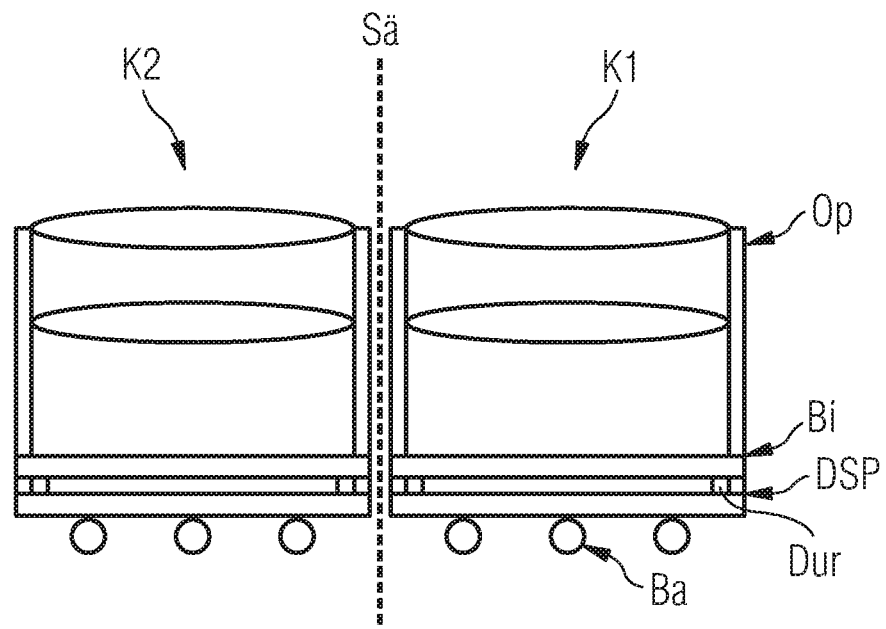
FIG. 1: shows a first embodiment variant of a camera.

FIG. 1 shows two cameras K1 and K2. These each consist of an optical component Op, an image sensor Bi, and a digital signal processor DSP. The optical component Op serves to direct incident light onto the image sensor Bi; it can include e.g. diaphragms, lenses and/or further optical components. The image sensor Bi records two-dimensional images; for the visible and near-infrared range it can be e.g. a CCD (Charge Coupled Device) or CMOS sensor. The digital signal processor DSP handles the digital processing of the analog data captured by the image sensor Bi.

The electrical connection of the chips DSP and Bi is established via a plated-through hole Dur, i.e. by means of a vertical electrical connection (Vertical Interconnect Access) between the chips. In this case the top side of the lower chip, i.e. the digital signal processor DSP, is connected to the bottom side of the upper chip, i.e. the image sensor Bi. Alternatively a hole can be introduced into the upper chip in such a way that its metal layer remains intact and consequently a connection exists through the chip to its top side.

The balls Ba are part of a ball grid array (BGA) and serve for the subsequent electrical contacting and fixing of the cameras K1, K2 for their installation. The balls Ba are terminals in the form of tiny solder spheres which are positioned adjacent to one another in a grid made up of columns and rows. The carrier substrate for the balls Ba in this arrangement is the underside of the bottommost chip, i.e. the digital signal processor DSP.

Further components which are not essential to an understanding of the invention can be added to the cameras K1, K2.

The cameras K1, K2 can be produced as follows: the process begins with a first wafer on which a plurality of digital signal processors DSP are arranged. Said first wafer is joined, e.g. by gluing or soldering, to a second wafer on which a plurality of image sensors Bi are arranged. Finally a third wafer on which a plurality of optical components Op are arranged is joined to the second wafer, e.g. by gluing. The third wafer can be e.g. a glass wafer. The individual optical components Op can be produced by stamping the glass wafer. In this way the components Op, Bi, DSP are joined at wafer level.

The three wafers may also be joined in a different sequence. In other words, the second and third wafers can also be joined to each other first, before the first wafer is added.

The density and distribution of the digital signal processors DSP on the first wafer, of the image sensors Bi on the second wafer, and of the optical components Op on the third wafer are identical. Preferably the distribution in each case corresponds to a uniform grid or an array. In this way, assuming the three wafers are approximately equal in size, precisely one image sensor Bi of the second wafer and one optical component Op of the third wafer are present for each digital signal processor DSP of the first wafer. Furthermore the second wafer is placed onto the first wafer in such a way that the image sensors Bi are arranged—as can be seen in FIG. 1—above the digital signal processors DSP, and the third wafer is placed onto the second wafer in such a way that the optical components Op are arranged—as can be seen in FIG. 1—above the image sensors Bi. This corresponds to an adjustment of the cameras K1, K2 in the x-y plane, the x-y plane being understood to mean a plane parallel to the three wafers.

Following the joining of the three wafers an overall wafer is present which contains a plurality of cameras K1, K2, only two cameras K1, K2 being shown in FIG. 1 for the sake of simplicity. The cameras K1, K2 are separated from each other by sawing the overall wafer. A sawing edge Sä between the cameras K1 and K2 is indicated schematically in FIG. 1.

The advantage of using wafers or slices, each containing a plurality of components Op, Bi, DSP, is that only a single adjustment in relation to another wafer is necessary for each wafer. By means of said single adjustment all of the cameras which are contained in the resulting overall wafer are adjusted simultaneously. This considerably simplifies the production of the cameras.

Other chips can also be used instead of or in addition to the digital signal processors DSP of FIG. 1.

Figure 2:
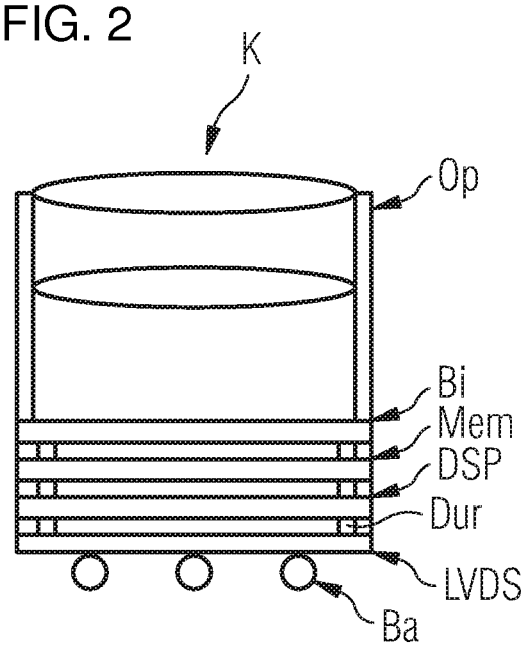
FIG. 2: shows a second embodiment variant of a camera.

FIG. 2 shows an embodiment variant of a camera K in which an LVDS chip LVDS (LVDS: Low Voltage Differential Signaling) and a memory chip Mem are also present in addition to a digital signal processor DSP. Said camera K is produced as explained in relation to FIG. 1, i.e. a wafer containing a plurality of LVDS chips LVDS is joined to a wafer containing a plurality of digital signal processors DSP, which is joined to a wafer containing a plurality of memory chips Mem, which is joined to a wafer containing a plurality of image sensors Bi, which is joined to a wafer containing a plurality of optical components Op. With regard to the chronological sequence of the joins, different approaches can be adopted. The chips LVDS, DSP, Mem, Bi can be electrically connected by means of a plated-through hole Dur. The resulting overall wafer comprises a plurality of cameras K which are separated from one another by sawing the overall wafer.

Alternatively to the use of wafers for all of the components it is also possible to use some components in the form of wafers and other components in the form of discrete parts. In relation to the cameras of FIG. 1, for example, a first wafer containing digital signal processors DSP can be used onto which a second wafer containing image sensors Bi is superimposed, a single optical component Op subsequently being fixed to each image sensor Bi of the second wafer. The discrete parts can be obtained prior to this by sawing a wafer which comprises a plurality of the respective components.

Figure 3:
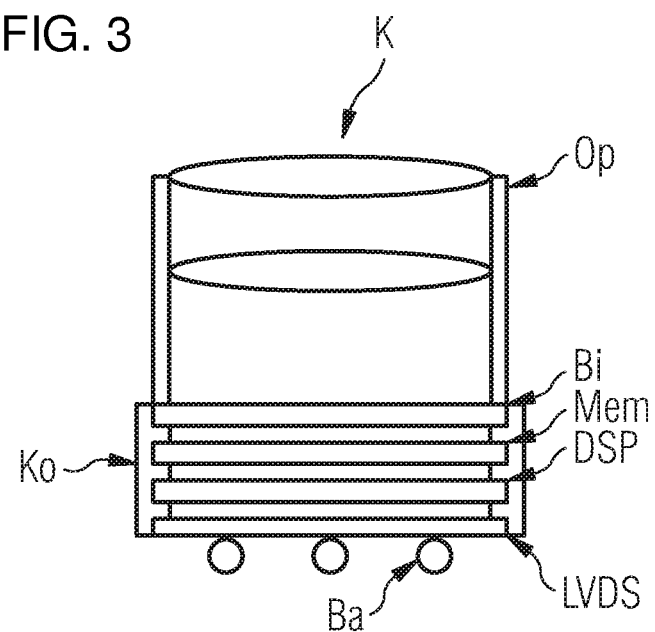
FIG. 3: shows a third embodiment variant of a camera.

FIG. 3 shows a further embodiment variant of a camera. In respect of its components this corresponds to that of FIG. 2. Located at the side edge, i.e. at the sawing edge, is a connection Ko which was applied from outside after the sawing step and allows a connection between the individual chips Bi, Mem, DSP, and LVDS. This sidewise access to the chip surface can be realized by means of etching e.g. by making recesses in the adhesive that was used to bond the chips to one another. Owing to the connection Ko a plated-through hole is not necessary.

Figure 4:
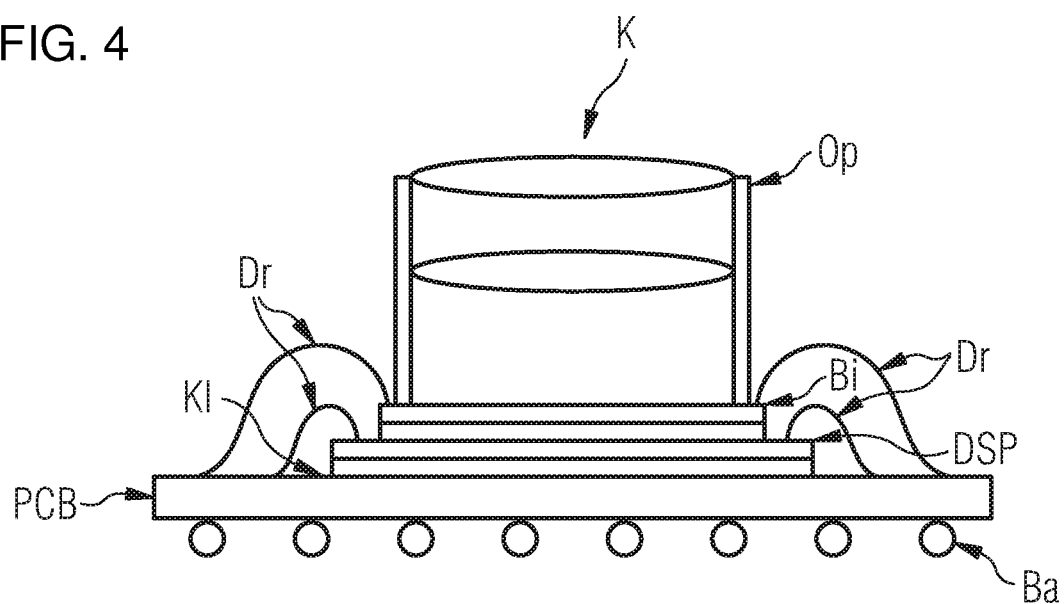
FIG. 4: shows a fourth embodiment variant of a camera.

A camera K in which, as in FIG. 1, an optical component Op is mounted on an image sensor Bi in a stack-like arrangement, which image sensor Bi is mounted on a digital signal processor DSP, can also be implemented in accordance with the embodiment variant shown in FIG. 4. In this case the digital signal processor DSP is located on a printed circuit board PCB. The carrier substrate for the balls Ba is the underside of the printed circuit board PCB. Instead of the plated-through hole connection, the two chips Bi and DSP are each connected to the printed circuit board PCB by means of wires Dr. Instead of the plated-through hole Dur of FIG. 1, the wires Dr and the printed circuit board PCB are used in the case of the camera K of FIG. 4. Other chips, such as e.g. an LVDS chip and/or a memory chip, can also be used instead of or in addition to the digital signal processor DSP of FIG. 4.

Because of the wires Dr it is not possible, as explained in relation to FIGS. 1 and 2, to use a wafer containing digital signal processors DSP, as well as a wafer containing image sensors Bi and a wafer containing optical components Op. It is possible, on the other hand, to attach a plurality of stacks, each containing a digital signal processor DSP, an image sensor Bi and an optical component Op, to the printed circuit board PCB and subsequently to saw the latter apart in order to obtain the individual cameras. The bond between the chips, as well as between the printed circuit board PCB and the chip mounted thereon, can be realized by gluing; the adhesive K1 is shown by way of example in FIG. 4 between the printed circuit board PCB and the digital signal processor DSP.

A common feature shared by the cameras described is that owing to their stack-like structure they are small in dimension. This is advantageous for all applications in which only a small amount of space is available for the camera. Furthermore an efficient and cost-effective production of the cameras can be realized in particular when wafers are used.

The cameras described are preferably employed in the automotive engineering sector. Suitable examples of this are systems which record and analyze the vehicle's environment, in other words e.g. lane detection, vehicle identification, pedestrian detection, parking assistance, cyclist detection, driver identification, collision warning, in addition also to systems which record and analyze the interior of the vehicle, in other words e.g. driver fatigue detection, driver identification, etc. However, the cameras described are also suitable for applications outside of automotive engineering, in other words e.g. in mobile communication devices.

The invention has been described in the foregoing with reference to an exemplary embodiment. It is to be understood that numerous variations and modifications are possible without leaving the scope of the invention.

The invention claimed is:

1. A method of producing an image acquisition system, the method which comprises the following steps:
    providing a first wafer containing a plurality of chips of similar type, the chips being configured for processing, storing, and/or forwarding information captured by a respective sensor;
    providing a second wafer containing a plurality of radiation detecting sensors of similar type;
    providing a third wafer with a plurality of optical components of similar type;
    joining the first, second, and third wafers to one another such that a respective optical component, a respective sensor, and a respective chip are connected to one another, with the sensor located underneath the optical component and the chip located underneath the sensor; and
    sawing the wafers apart and leaving the respective optical component, the respective sensor, and the respective chip joined to one another.

2. The method according to claim 1, which comprises joining the optical component and the sensor to each other by gluing.

3. The method according to claim 1, which comprises joining the optical component and the chip to each other by gluing.

4. The method according to claim 1, which comprises joining the optical component and the chip to each other by soldering.

5. The method according to claim 1, which comprises, subsequent to the sawing step, establishing an electrical connection between the sensor and the chip at at least one sawing edge.

6. The method according to claim 1, which comprises, subsequent to the sawing step:
    etching an adhesive that bonds the sensor and the chip from at least one sawing edge to obtain at least one recess providing a sidewise access to the sensor and the chip; and
    establishing an electrical connection between the sensor and the chip at the at least one sawing edge.

* * * * *